(12) United States Patent
Park et al.

(10) Patent No.: US 10,734,407 B2
(45) Date of Patent: Aug. 4, 2020

(54) MANUFACTURING METHOD OF SEMICONDUCTOR DEVICE

(71) Applicant: SK hynix Inc., Icheon-si, Gyeonggi-do (KR)

(72) Inventors: Hae Chan Park, Cheongju-si (KR); Jang Won Kim, Cheongju-si (KR); Gong Hyun Sa, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/448,844

(22) Filed: Jun. 21, 2019

(65) Prior Publication Data
US 2019/0312057 A1    Oct. 10, 2019

Related U.S. Application Data

(63) Continuation of application No. 15/487,761, filed on Apr. 14, 2017, now Pat. No. 10,373,971.

(30) Foreign Application Priority Data

Aug. 19, 2016  (KR) ........................ 10-2016-0105752

(51) Int. Cl.
*H01L 27/115* (2017.01)
*H01L 27/11582* (2017.01)
*H01L 21/02* (2006.01)
*H01L 21/762* (2006.01)
*H01L 21/768* (2006.01)

(52) U.S. Cl.
CPC .. *H01L 27/11582* (2013.01); *H01L 21/02636* (2013.01); *H01L 21/762* (2013.01); *H01L 21/76871* (2013.01); *H01L 21/76877* (2013.01)

(58) Field of Classification Search
CPC combination set(s) only.
See application file for complete search history.

(56) References Cited

U.S. PATENT DOCUMENTS

2015/0249093 A1*  9/2015  Lee .................. H01L 27/11582
                                                 257/324

FOREIGN PATENT DOCUMENTS

| KR | 1020120126332 A | 11/2012 |
| KR | 1020140093421 A | 7/2014 |
| KR | 1020150103536 A | 9/2015 |

* cited by examiner

*Primary Examiner* — Tony Tran
(74) *Attorney, Agent, or Firm* — William Park & Associates Ltd.

(57) ABSTRACT

A manufacturing method of a semiconductor device may be provided. The method may include forming stacks including interlayer insulating layers and separated by a slit, the interlayer insulating layers surrounding a channel layer and stacked to be spaced apart from one another with an interlayer space interposed therebetween. The method may include forming a conductive pattern filling the interlayer space. The method may include forming an isolation layer on a surface of the conductive pattern by oxidizing a portion of the conductive pattern by performing an oxidizing process.

10 Claims, 11 Drawing Sheets

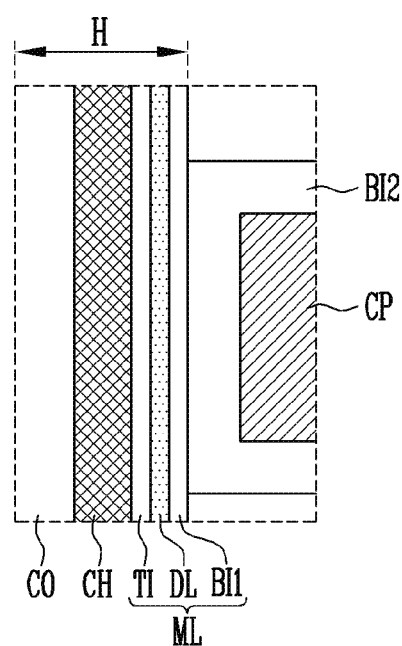

MANUFACTURING METHOD OF SEMICONDUCTOR DEVICE

CROSS-REFERENCE TO RELATED APPLICATION

The present application is a continuation application of U.S. application Ser. No. 15/487,761, filed on Apr. 14, 2017, and claims priority under 35 U.S.C § 119(a) to Korean patent application 10-2016-0105752 filed on Aug. 19, 2016 in the Korean Intellectual Property Office, the entire disclosure of which is incorporated by reference herein.

BACKGROUND

1. Technical Field

An aspect of the disclosure may generally relate to a semiconductor device and a manufacturing method thereof, and more particularly, to a semiconductor device including a conductive pattern and a manufacturing method thereof.

2. Related Art

A semiconductor device has a plurality of conductive patterns. The conductive patterns are arranged in various structures in accordance with a design of the semiconductor device.

A three-dimensional semiconductor device consisting of a three-dimensional memory device has been proposed. The conductive pattern of the three-dimensional semiconductor device may be arranged between interlayer insulting layers surrounding a channel layer and stacked to be spaced apart from one another. In such a conductive pattern of the three-dimensional semiconductor device, it is difficult to achieve low resistance due to various reasons.

SUMMARY

According to an aspect of the disclosure, there is provided a semiconductor device. The semiconductor device may include a channel layer. The semiconductor device may include interlayer insulating layers surrounding the channel layer and stacked to be spaced apart from one another along an extension direction of the channel layer. The semiconductor device may include conductive patterns filling interlayer spaces between the insulating layers adjacent to one another, and deviating from the interlayer spaces. The semiconductor device may include first isolation layers covering a portion of the conductive patterns that deviate from the interlayer spaces.

According to an aspect of the disclosure, there is provided a manufacturing method of a semiconductor device. The method may include forming stacks including interlayer insulating layers and separated by a slit, the interlayer insulating layers surrounding a channel layer and stacked to be spaced apart from one another with an interlayer space interposed therebetween. The method may include forming a conductive pattern filling the interlayer space. The method may include forming an isolation layer on a surface of the conductive pattern by oxidizing a portion of the conductive pattern by performing an oxidizing process.

BRIEF DESCRIPTION OF THE DRAWINGS

FIG. 2 is an enlarged diagram illustrating a representation of an example of region A illustrated in FIGS. 1A and 1B.

DETAILED DESCRIPTION

Figure 1A:
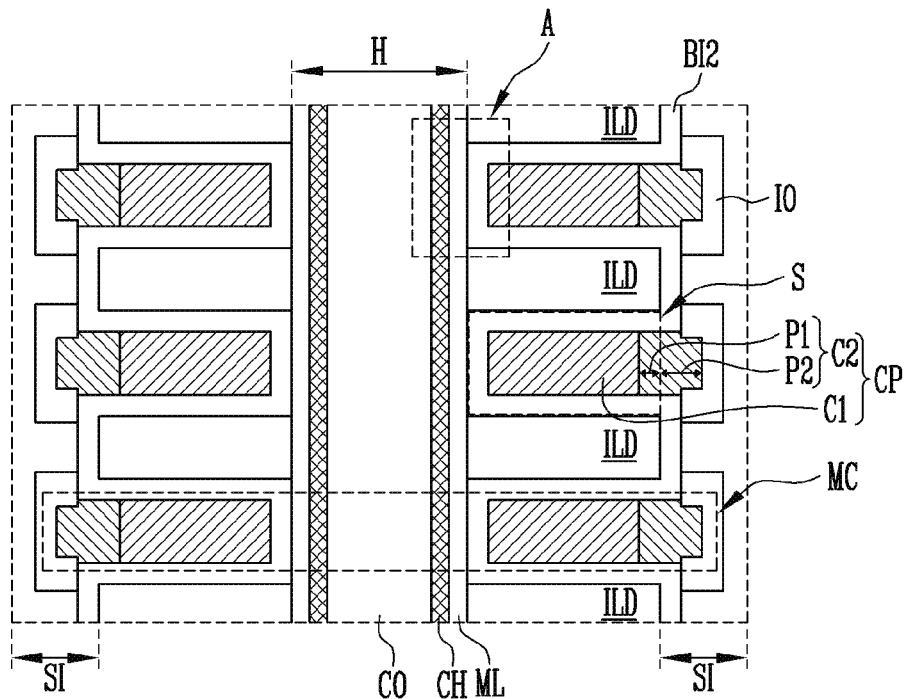
FIGS. 1A and 1B are cross-sectional diagrams illustrating a representation of an example of a conductive pattern of a semiconductor device according to an embodiment of the present disclosure.

Hereafter, embodiments will be described with reference to the accompanying figures. However, the technical range of the present disclosure is not limited to the detailed description of the specification but embodiments should not be construed as limited to the particular shapes of regions illustrated herein but may include deviations in shapes. It will be understood by those skilled in the art that various changes in form and details may be made without departing from the spirit and scope of the description as set forth in the following claims. Like reference numerals in the drawings denote like elements.

Various embodiments may relate to a semiconductor device capable of improving the resistance of a conductive pattern and a manufacturing method thereof.

Figure 1B:
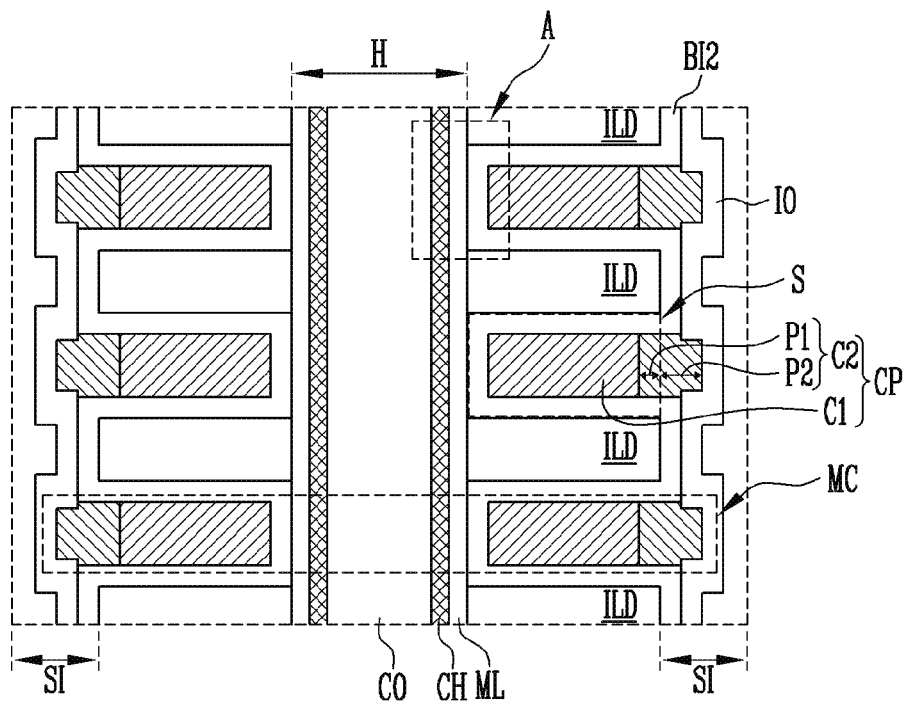

FIGS. 1A and 1B are cross-sectional diagrams illustrating a representation of an example of a conductive pattern of a semiconductor device according to an embodiment of the present disclosure.

Referring to FIGS. 1A and 1B, a semiconductor device according to an embodiment of the present disclosure may include memory cells MC in a gate all around (GAA) structure stacked along a channel layer CH while being spaced apart from one another. The memory cells MC arranged at different heights from one another may be insulated from one another by interlayer insulating layers ILD. The memory cells MC and the interlayer insulating layers ILD may be alternately stacked along the channel layer CH.

Gates of the memory cells MC may be connected to conductive patterns CP. Each of the memory cells MC may further include a multilayer ML. The multilayer ML may be arranged between the channel layer CH and the conductive patterns CP.

The multilayer ML may be formed as a liner type on a side wall of a hole H penetrating the conductive patterns CP and the interlayer insulating layers ILD. The multilayer ML may include a data storing layer that stores charge. The multilayer ML may further include a tunnel insulating layer and a first blocking insulating layer with the data storing layer interposed therebetween. Configurations of the multilayer ML may be further discussed with regards to FIG. 2.

The channel layer CH may be formed as a tube type surrounding a core insulating layer CO that fills a central area of the hole H. Alternatively, the channel layer CH may be formed to completely fill the central area of the hole H. A cross-section of the hole H may be formed in various structures such as a circle, an oval, a rectangular, a square, or a polygonal type.

The conductive patterns CP may fill interlayer spaces S between the interlayer insulating layers ILD arranged at different heights, respectively, and extend to deviate from the interlayer spaces S. The conductive patterns CP may be formed to have a greater volume than the interlayer spaces S. Accordingly, in the present disclosure, each resistance of the conductive patterns may be reduced.

A portion of each of the conductive patterns CP that deviate from the interlayer spaces S may be covered with an isolation layer IO. The isolation layer IO may be formed by oxidizing the conductive patterns CP. The isolation layer IO may contact the interlayer insulating layers ILD or contact a second blocking insulating layer BI2 formed on a surface of the interlayer insulating layers ILD so that the interlayer spaces S are sealed.

The portions of the conductive patterns CP outside the interlayer spaces S may not be insulated by the interlayer insulating layers ILD. The isolation layer IO may prevent a bridge error where the portions of the conductive patterns CP arranged on different layers are connected to one another while not being insulated by the interlayer insulating layers ILD. In addition, an insulating distance between the conductive patterns CP arranged different layers may be achieved by the isolation layer IO.

The interlayer insulating layers ILD may surround the channel layer CH and be stacked to be spaced apart from one another along an extension direction of the channel layer CH. Edges of the interlayer insulating layers ILD may be defined by a slit SI. A side wall of the slit SI may be arranged on the same line with the edges of the interlayer insulating layers ILD. The interlayer spaces S filled with the conductive patterns CP, respectively, may be defined between the interlayer insulating layers ILD arranged on the different layers and adjacent to one another.

Each of the conductive patterns CP may include a first conductive pattern C1 and a second conductive pattern C2. The first conductive pattern C1 may surround the channel layer CH and fill a portion adjacent to the channel layer CH of a single interlayer space S corresponding thereto. The second conductive pattern C2 may contact the first conductive pattern C1, fill the remaining portion of the single interlayer space S, and extend toward the slit SI outside the single interlayer space S.

The first conductive pattern C1 may be formed of various conductive materials used as a growth seed layer of the second conductive pattern C2. The first conductive pattern C1 may be formed of a conductive material with low resistance. For example, the first conductive pattern C1 may be formed of metal. For example, the first conductive pattern C1 may include tungsten. An edge of each interlayer insulating layer ILD may protrude further toward the slit SI than the first conductive pattern C1. That is, the first conductive pattern C1 may be indented toward the channel layer CH rather than the interlayer insulating layers ILD.

The second conductive patterns C2 may be formed of various conductive materials with low resistance. The second conductive pattern C2 may grow from the first conductive pattern C1, and be formed of the same metal as the conductive pattern C1. For example, the second conductive pattern C2 may include tungsten. The second conductive pattern C2 grown from the first conductive pattern C1 may have a resistivity greater than the first conductive pattern C1. The second conductive pattern C2 may include a first portion P1 and a second portion P2. The first portion P1 may fill a portion of the interlayer space S corresponding thereto. A portion of the interlayer space S filled with the first portion P1 may be an area that is not filled with the first conductive pattern C1 of an entire area of the interlayer space S. The second portion P2 may extend outwardly to an outside of the interlayer space S from the first portion P1. The second portions P2 may further protrude toward the slit SI than the edges of the interlayer insulating layers ILD. The second portions P2 protruding further than the interlayer insulating layers ILD may increase a volume of each of the conductive patterns CP, thereby reducing the resistance of each of the conductive patterns CP.

Each of the conductive patterns CP including the first conductive pattern C1 and the second conductive pattern C2 may be formed on the second blocking insulating layer BI2. The second blocking insulating layer BI2 may be formed of the same insulating material as the first blocking insulating layer of the multilayer ML, or an insulating material with higher permittivity than the first blocking insulating layer. For example, the first blocking insulating layer and the second blocking insulating layer BI2 of the multi-layer ML may be formed of a silicon oxide. For another example, the first blocking insulating layer may be formed of a silicon oxide and the second blocking insulating layer may be formed of an aluminum oxide. The second blocking insulating layer BI2 may be formed on surfaces of the interlayer spaces S and the side walls of the slit SI. In some cases, the second blocking insulating layer BI2 may be not formed.

The portions of the conductive patterns CP deviating from the interlayer spaces S between the interlayer insulating layers ILD may be insulated by the isolation layer IO. The isolation layer IO may be formed by oxidizing a portion of the second conductive pattern C2 to minimize volume damage of the conductive patterns CP. As a result, the isolating layer IO may be formed of an oxide of the second conductive pattern C2. For example, the isolation layer IO may include a tungsten oxide.

The isolation layer IO may be formed to cover a side wall of the second portion P2 of the second conductive pattern C2. The isolation layer IO may be formed in various structures depending on the presence of conductive residues generated during a manufacturing process of a semiconductor device.

For example, when the conductive residues do not remain on the sidewalls of the slit SI, a plurality of isolation layers I0 may seal the interlayer spaces S as described in FIG. 1A. In addition, the isolation layers IO may be separated from one another. The sidewalls of the conductive patterns CP may be covered with the isolation layers I0, respectively, the isolation layers I0 may be formed of an oxide of the conductive patterns CP. The isolation layers I0 may electrically separate the conductive patterns arranged on different layers from one another.

In another example, when the conductive residues remain on the sidewalls of the slit SI, the isolation layer I0 may include first isolation layers and second isolation layers. The first and second isolation layers may be portions of the isolation layer I0 illustrated in FIG. 1B. For example, the first isolation layers may be portions of the isolation layer I0 contacting the conductive patterns CP, and the second isolation layers may be portions of the isolation layer I0 arranged on the sidewalls of the slit SI defining edges of the interlayer insulating layers ILD. The second isolation layers may be formed of an oxide of the conductive residues. The first isolation layers may be connected by the second isolation layers.

FIG. 2 is an enlarged diagram illustrating a representation of an example of region A illustrated in FIGS. 1A and 1B.

Referring to FIG. 2, the multilayer ML as described in FIGS. 1A and 1B may include a data storing layer DL, a tunnel insulating layer TI arranged between the data storing layer DL and the channel layer CH, and a first blocking insulating layer BI1 surrounding the data storing layer DL. The data storing layer DL, the tunnel insulating layer TI and the first blocking insulating layer BI1 may extend along the sidewall of the hole H, and surround the channel layer CH. The data storing layer DL may be formed of a material layer that allows for charge trap. For example, the data storing layer DL may be formed of a silicon nitride. The tunnel insulating layer TI may be formed of a silicon oxide that allows for charge tunneling. The first blocking insulating layer BI1 may be formed a material layer that allow for blocking charge.

The channel layer CH may be formed in a tube type surrounding the core insulating layer C0, but the embodiments are not limited thereto. That is, the channel layer CH may not be limited to a tube type, but formed in various structures.

The first blocking insulating layer BI1 may contact the second blocking insulating layer BI2 formed on a surface of each conductive pattern CP, but the embodiments are not limited thereto. For example, the second blocking insulating layer BI2 may not be formed, and the first blocking insulating layer BI1 may contact each conductive pattern CP.

The first blocking insulating layer BI1 may not be formed. The second blocking insulating layer BI2 may contact the data storing layer DL of the multilayer ML.

Figure 3A:
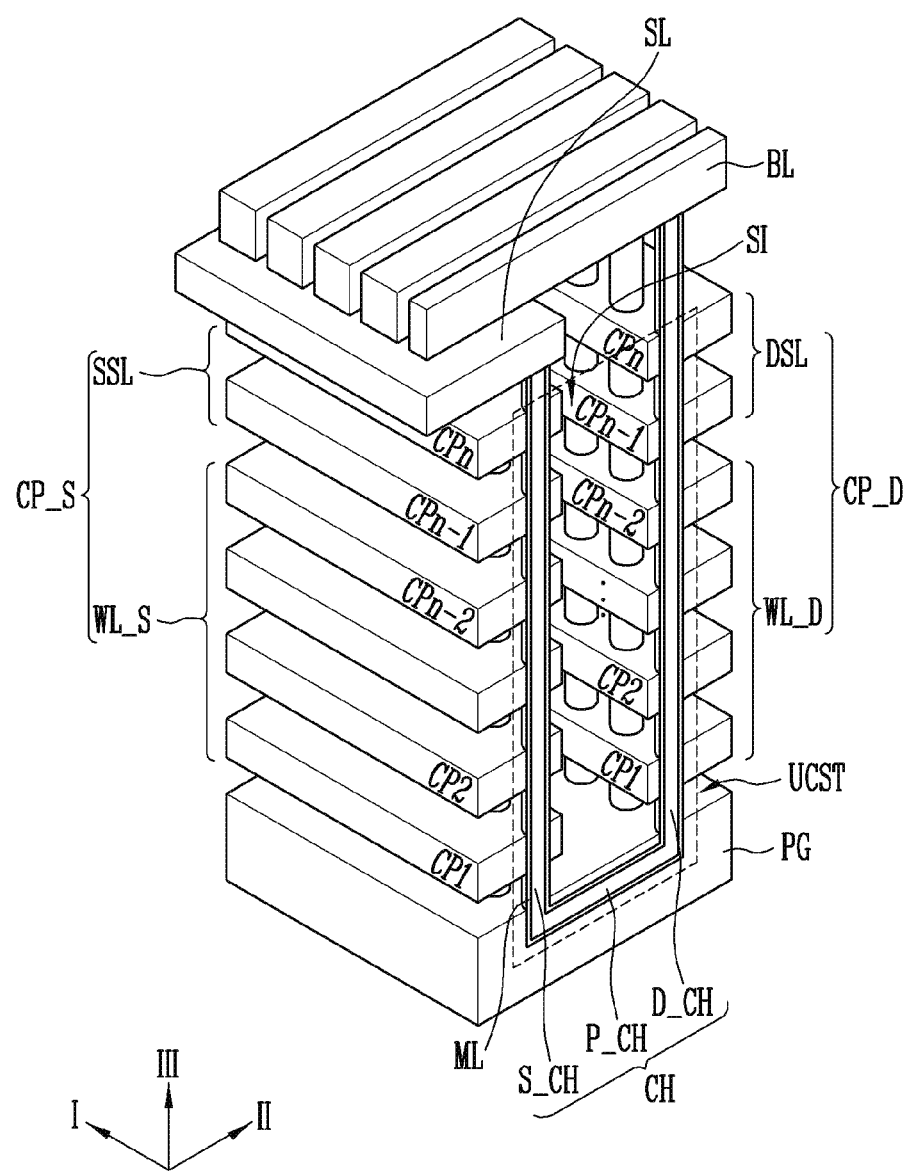
FIGS. 3A to 3C are perspective diagrams illustrating representations of examples of various structures of a semiconductor device including a conductive pattern according to an embodiment of the present disclosure.
Figure 3B:
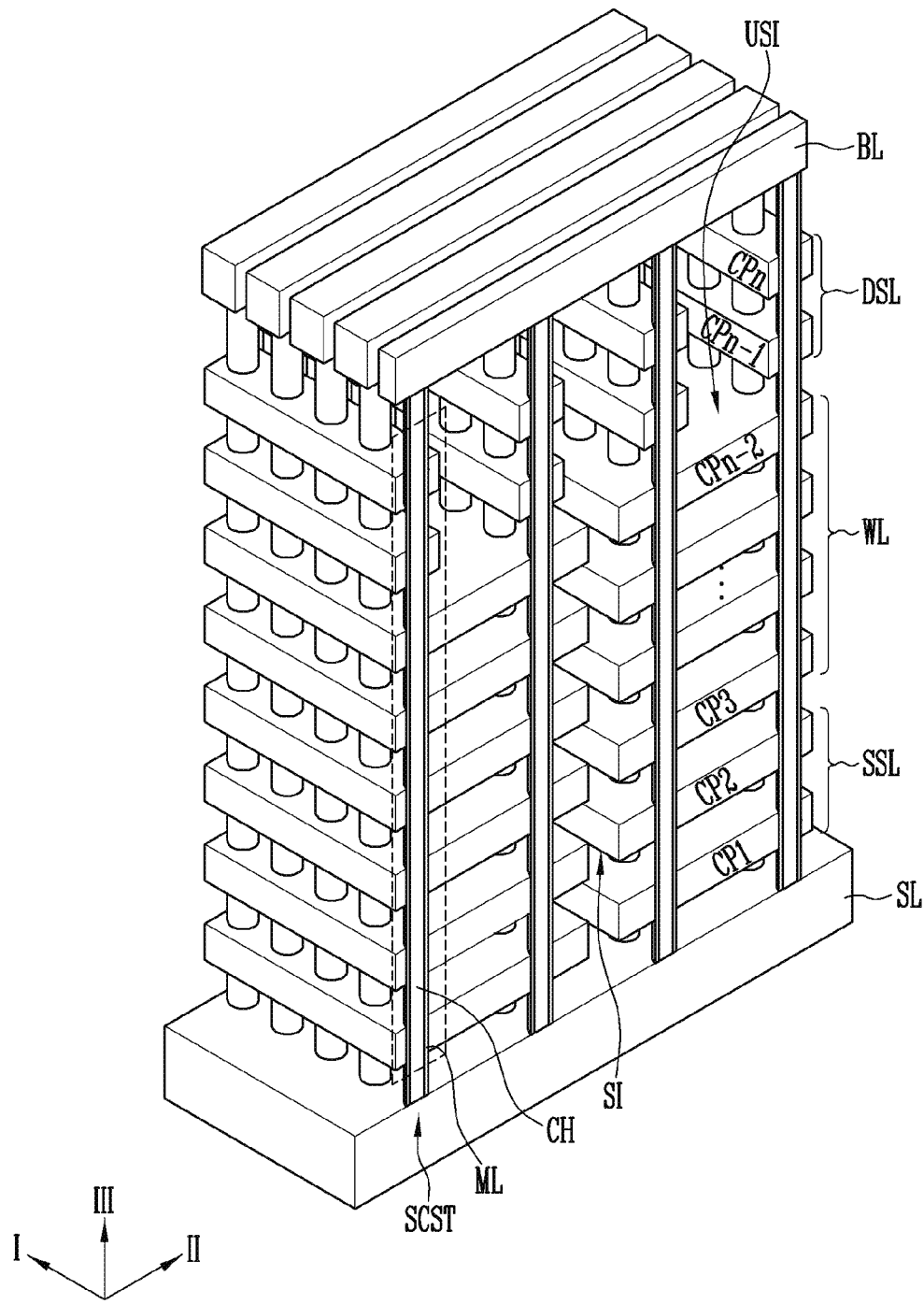
Figure 3C:
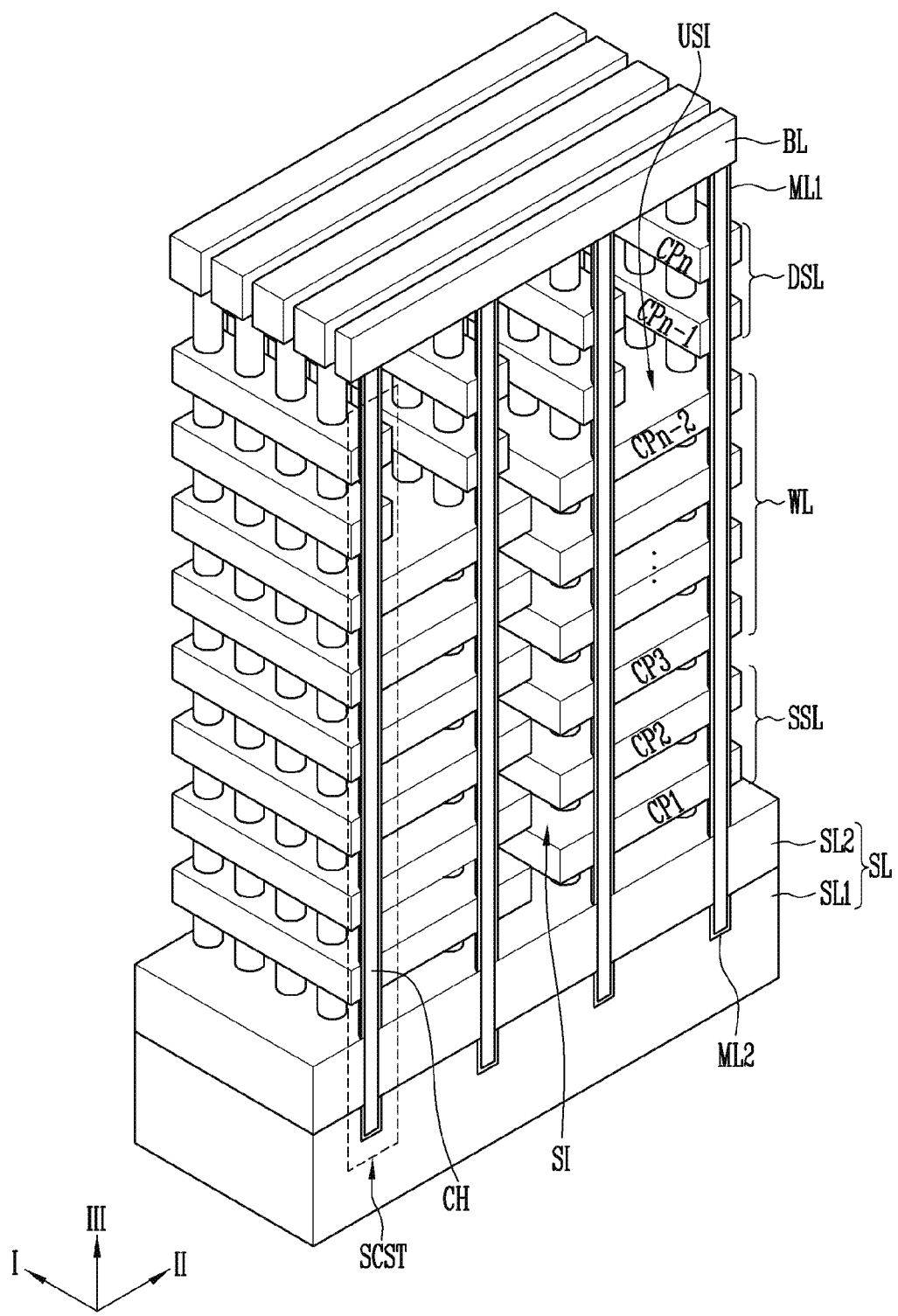

FIGS. 3A to 3C are perspective diagrams illustrating representations of examples of various structures of a semiconductor device including a conductive pattern according to an embodiment of the present disclosure. For example, FIGS. 3A to 3B are perspective diagrams for describing three-dimensional memory strings. Interlayer insulating layers are not illustrated in FIGS. 3A to 3B for the convenience of explanation.

A memory string according to an embodiment may be formed in a three-dimensional structure for high integration of a semiconductor device. For example, the memory string may be formed in a U type as illustrated in FIG. 3A, or in a straight type as illustrated in FIGS. 3B and 3C.

Referring to FIG. 3A, a memory string UCST in a U type may include memory cells and select transistors arranged along the channel layer CH in a U type. Gates of the memory cells and gates of the select transistors may be portions of the conductive patterns (CP1 to CPn). Each of the conductive patterns (CP1 to CPn) may include a first conductive pattern C1 and a second conductive pattern C2 in the structure as described in FIGS. 1A and 1B, and a portion thereof may be covered with the isolation layer I0 in the structure as described in FIG. 1A or FIG. 1B.

The channel layer CH may include a pipe channel layer P_CH embedded in a pipe gate PG, and a source side channel layer S_CH and a drain side channel layer D_CH extending from the pipe channel layer P_CH. The channel layer CH may be formed in a tube type by surrounding a core insulating layer that fills a central area of a U type hole, or be formed to completely fill the central area of the U type hole. An outer wall of the channel layer CH may be surrounded by the multilayer ML.

The channel layer CH may be electrically connected between a source line SL and a bit line BL. The bit line BL and the source line SL may be arranged on different layers and spaced apart from each other. For example, the source line SL may be arranged under the bit line BL. The source line SL may be electrically connected to a top of the source side channel layer S_CH. The source line SL may extend in a first direction I. A source contact plug may be formed between the source line SL and the source side channel layer S_CH. The bit line BL may be electrically connected to a top of the drain side channel layer D_CH. The bit line BL may extend in a second direction II intersecting the first direction I. A drain contact plug may be formed between the bit line BL and the drain side channel layer D_CH.

The conductive patterns CP1 to CPn may be formed in n layers spaced apart from one another under the bit line BL and the source line SL. The conductive patterns CP1 to CPn may include source side conductive patterns CP_S and drain side conductive patterns CP_D.

The source side conductive patterns CP_S may surround the source side channel layer S_CH and be stacked to be spaced apart from one another. The source side conductive patterns CP_S may include source side word lines WL_S and a source select line SSL. The source select line SSL may be arranged on the source side word lines WL_S. The source select line SSL may be arranged in one or two or more layers on the source side word lines WL_S. FIG. 3A exemplifies that the source select line SSL consists of an nth pattern CPn arranged on the uppermost layer of the source side conductive patterns CP_S and an (n−1)th pattern CPn−1 under the nth pattern CPn, but the embodiments are not limited thereto.

The drain side conductive patterns CP_D may surround the drain side channel layer D_CH and be stacked to be spaced apart from one another. The drain side conductive patterns CP_D may include drain side word lines WL_D and a drain select line DSL. The drain select line DSL may be arranged in the drain side word lines WL_D. The drain select line DSL may be arranged in one or two or more layers on the drain side word lines WL_D. FIG. 3A exemplifies that the drain select line DSL consists of an nth pattern CPn arranged on the uppermost layer of the drain side conductive patterns CP_D and an (n−1)th pattern CPn−1 under the nth pattern CPn, but the present embodiments are not limited thereto.

The source side conductive patterns CP_S and the conductive patterns CP_D may be separated from each other with the slit SI interposed therebetween.

The pipe gate PG may be arranged under the source side conductive patterns CP_S and the drain side conductive patterns CP_D, and be formed to surround the pipe channel layer P_CH. The pipe gate PG may be arranged under the conductive patterns CP1 to CPn.

Source side memory cells may be formed at interconnections of the source side channel layer S_CH and the source side word lines WL_S, and drain side memory cells may be formed at interconnections of the drain side channel layer D_CH and the drain side word line WL_D. A source select transistor may be formed at an interconnection of the source side channel layer S_CH and the source select line SSL, and a drain select transistor may be formed at an interconnection of the drain side channel layer D_CH and the drain select line DSL. A pipe transistor may be formed at an interconnection of the pipe channel layer P_CH and the pipe gate PG. The source select transistor, the source side memory cells, the pipe transistor, the drain side memory cells, and the drain select transistor arranged along a single channel layer CH may be connected in series through the channel layer CH. The source select transistor, the source side memory cells, the pipe transistor, the drain side memory cells and the drain select transistor connected in series may define a U Type memory string UCST in accordance with a U type shape of the channel layer CH. The source side word lines WL_S may transmit signals to gates of the source side memory cells, and the drain side word lines WL_D may transmit signals to gates of the drain side memory cells, the source select line SSL may transmit a signal to a gate of the source select transistor, the drain select line DSL may transmit a signal to a gate of the drain select transistor, and the pipe gate PG may transmit a signal to a gate of the pipe transistor. The pipe transistor may respond to a signal applied to the pipe gate PG, and connect the source side memory cells to the drain side memory cells.

The channel layer CH may be formed in various types such as a W type in addition to the U type as described above. According to the structure of the channel layer CH, arrangement of the memory cells may be variously determined, and the memory string structure may be formed in various shapes accordingly.

Referring to FIGS. 3B and 3C, a memory string SCST in a straight type may include memory cells and select transistors stacked along a channel layer CH in a straight type. The gates of the memory cells and the gates of the select transistors may be connected to the conductive patterns CP1 to CPn. Each of the conductive patterns CP1 to CPn may include the first conductive pattern C1 and the second conductive pattern C2 in the structure as described in FIGS. 1A and 1B, and the portion of the conductive patterns CP may be covered with the isolation layer I0 in the structure as described in FIG. 1A or FIG. 1B.

The channel layer CH may be formed in a tube type surrounding a core insulating layer that fills a central area of the hole in a straight type, or be formed to completely fill the central area of the hole in the straight type.

A top of the channel layer CH may be electrically connected to the bit line BL. The bit line BL may extend in the second direction II. A drain contact plug (not illustrated) may be further formed between the bit line BL and the channel layer CH.

The channel layer CH may be connected to the source line SL. The source line SL may be formed in various structures.

Referring to FIG. 3B, a source line SL may contact a bottom of the channel layer CH. The source line SL may be a doped poly silicon layer. The channel layer CH may contact an upper surface of the source line SL and extend in a third direction III toward the bit line BL.

The side wall of the channel layer CH illustrated in FIG. 3B may be surrounded by the multilayer ML.

As illustrated in FIG. 3C, a lower portion of the channel layer CH may extend to the inside of the source line SL. That is, the lower portion of the channel layer CH may penetrate a portion of the source line SL.

For example, the source line SL may be formed in a stacked structure of a first source layer SL1 and a second source layer SL2. The first source layer SL1 may surround the lower portion of the channel layer CH. The second source layer SL2 may be arranged on a top of the first source layer SL1, and contact an upper surface of the first source layer SL1 and a sidewall of the channel layer CH. The second source layer SL2 may surround the channel layer CH.

An outer wall of the channel layer CH illustrated in FIG. 3C may be surrounded by a first multi-pattern ML1 or a second multi-pattern ML2. Each of the first multi-pattern ML1 and the second multi-pattern M2 may include the tunnel insulating layer TI, the data storing layer DL and the first blocking insulating layer BI1 illustrated in FIG. 2. The first multi-pattern ML1 may be formed to surround a sidewall of an upper portion of the channel layer CH protruding from the source line SL. The second multi-pattern ML2 may be arranged between the first source layer SL1 and the channel layer CH. The first multi-pattern ML1 and the second multi-pattern ML2 may be separated with the second source layer SL2 interposed therebetween.

Referring to FIGS. 3B and 3C, the conductive patterns CP1 to CPn may be arranged in n layers spaced apart from one another between the bit line BL and the source line SL. The conductive patterns CP1 to CPn may surround the channel layer CH to be stacked from one another. The conductive patterns CP1 to CPn may include the source select line SSL, the word lines WL and the drain select line DSL. The source select line SSL may be arranged on the source line SL. The word lines WL may be arranged on the source select line SSL. The drain select line DSL may be arranged on the word lines WL. The conductive patterns CP1 to CPn may be divided into a plurality of substructures by the slit SI.

The source select line SSL may be arranged in one or two or more layers under the word lines WL. FIG. 3B and FIG. 3C exemplify that the source select line SSL consists of the first conductive pattern CP1 arranged on the lowermost layer of the conductive patterns CP1 to CPn and the second conductive pattern CP2 above the first conductive pattern C1, but the present embodiments are not limited thereto.

The drain select line DSL may be arranged in one or two or more layers above the word lines WL. FIG. 3B and FIG. 3C exemplify that the drain select line DSL consists of the nth conductive pattern CPn arranged on the uppermost layer of the conductive patterns CP1 to CPn and the (n−1)th conductive pattern CPn−1 under the nth conductive pattern CPn, but the present embodiments are not limited thereto.

The conductive patterns CP1 to CPn may be separated by the slit SI. The source select line SSL and the drain select line DSL may be divided into a smaller unit than the word lines WL. For example, the channel layers CH commonly surrounded by the respective word lines WL may be surrounded by each of the drain select lines DSL separated from one another. The drain select line DSL may be divided by an upper slit USI in addition to the slit SI to be formed to have a smaller width than the word lines WL.

According to the structure as described in FIGS. 3B and 3C, the memory cells may be formed at interconnections between the channel layer CH and the word lines WL, the drain select transistor may be formed at an interconnection between the channel layer CH and the drain select line DSL, the source select transistor may be formed in an interconnection between the channel layer CH and the source select line SSL. The source select transistor, the memory cells, and the drain select transistor aligned in a row along a single channel layer CH may be connected in series through the channel layer CH, and define the memory string SCST in a straight type. The word lines WL may transmit signals to the gates of the memory cells, the source select line SSL may transmit a signal to a gate of the source select transistor, and the drain select line DSL may transmit a signal to a gate of the drain select transistor.

FIGS. 4A to 4G are cross-sectional diagrams illustrating representations of examples of a manufacturing method of a semiconductor device according to an embodiment of the present disclosure. A manufacturing method of the semiconductor devices illustrated in FIGS. 4A to 4G may be used to form the semiconductor devices illustrated in FIG. 1A. FIGS. 4A to 4G are cross-sectional diagrams taken along the second direction II in which the bit line BL illustrated in FIGS. 3A to 3C extends.

Figure 4A:
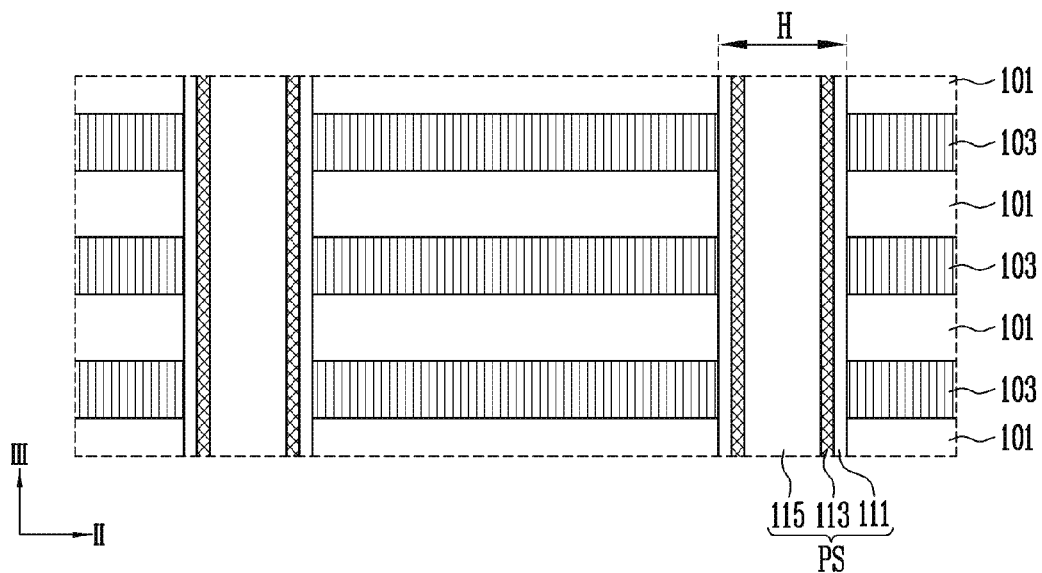
FIGS. 4A to 4G are cross-sectional diagrams illustrating representations of examples of a manufacturing method of a semiconductor device according to an embodiment of the present disclosure.

Referring to FIG. 4A, interlayer insulating layers 101 and sacrificial layers 103 may be alternately arranged on a lower structure (not illustrated). The number of interlayer insulating layers 101 and the sacrificial layers 103 may be determined in various combinations. The sacrificial layers 103 may be formed of a material different from the interlayer insulating layers 101. For example, the sacrificial layers 103 may be formed of a material having an etch selectivity with respect to the interlayer insulating layers 101. For example, the interlayer insulating layers 101 may be formed of an oxide, and the sacrificial layers 103 may be formed of a nitride having an etch selectivity with respect to an oxide.

The lower structure may include the pipe gate PG illustrated in FIG. 3A, the source line SL illustrated in FIG. 3B, or the first source line SL and a source sacrificial layer (not illustrated) illustrated in FIG. 3C.

Subsequently, the interlayer insulating layers 101 and the sacrificial layers 103 may be etched to form the holes H penetrating therethrough. A pillar structure PS may be formed in each of the holes H. Forming the pillar structure PS may include forming a multilayer 111 on a surface of each of the holes H, and forming the channel layer CH on the multilayer 111 (see FIG. 2). The multilayer 111 may be formed by sequentially stacking the first blocking insulating layer BI1, the data storing layer DL and the tunnel insulating layer TI as described in FIG. 2 on the side walls of the holes H. The channel layer CH may be formed of a semiconductor layer, for example, the channel layer CH may include a silicon layer. The channel layer CH may be formed to completely fill the inside of each of the holes H, or be formed in a liner type while opening the central area of each of the holes H. When the channel layer CH is formed in a liner type, forming the pillar structure PS may further include filling the central area of each of the holes H with a core insulating layer 115.

Figure 4B:
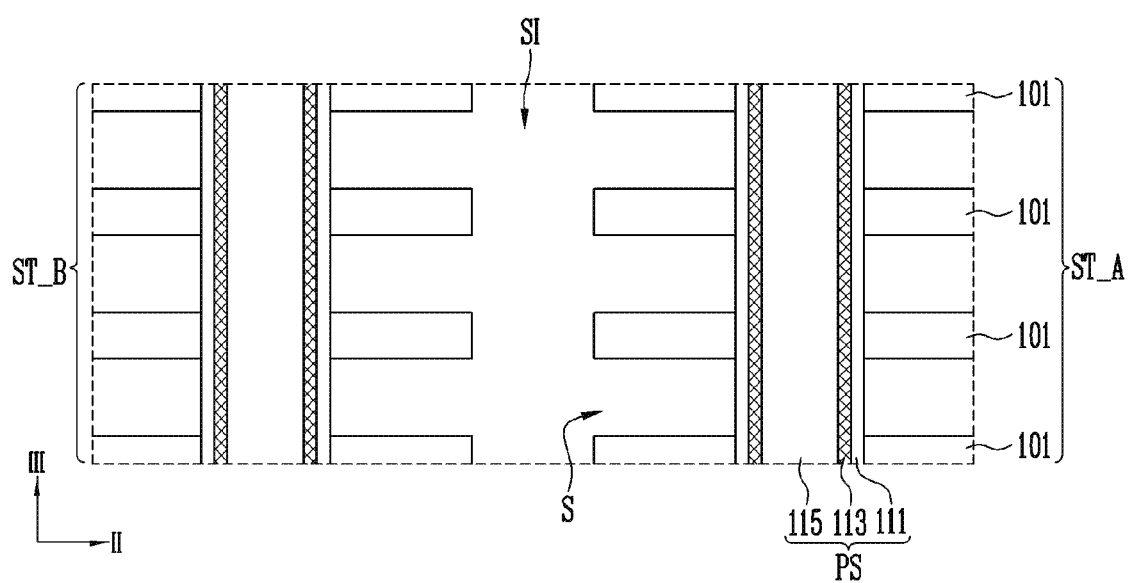

Referring to FIG. 4B, the slit SI to divide the interlayer insulating layers 101 into stacks ST_A and ST_B surrounding the pillar structures PS may be formed. The slit SI may be formed by etching the interlayer insulating layers 101 and the sacrificial layers (103 in FIG. 4A) between the pillar structures PS.

The sacrificial layers (103 of FIG. 4A) may be selectively removed by the slit SI. When the sacrificial layer (103 of FIG. 4A) is formed of a nitride, a phosphate may be used to selectively remove the sacrificial layers (103 of FIG. 4A). The interlayer spaces S may be opened between the interlayer insulating layers 101 adjacent to one another of each of the stacks ST_A and ST_B.

Figure 4C:
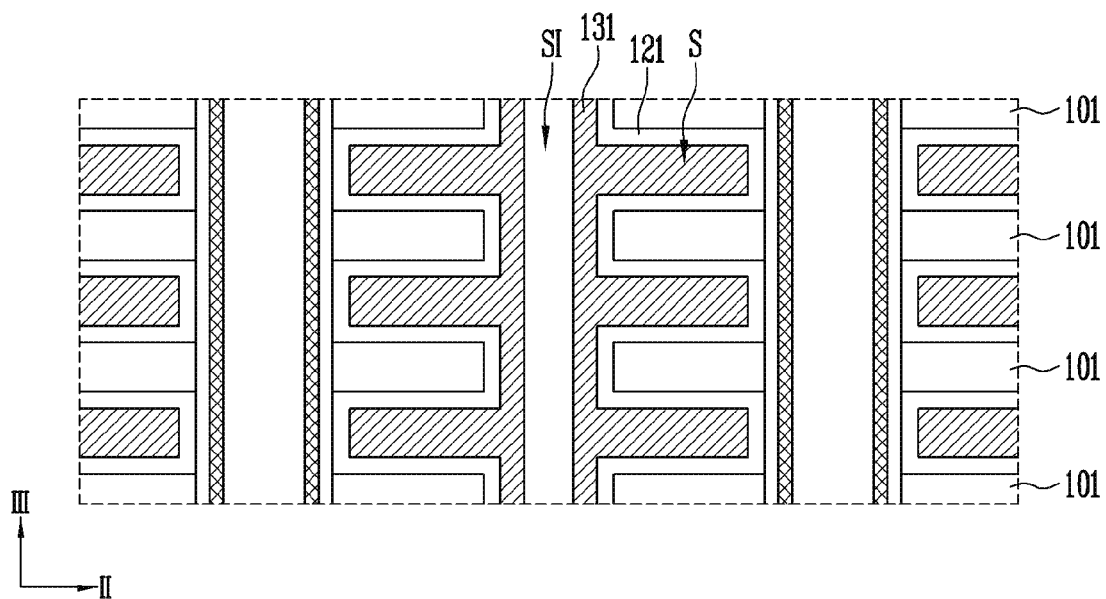

Referring to FIG. 4C, a first conductive layer 131 may be deposited within the interlayer spaces S by the slit SI to fill the interlayer spaces S. Prior to depositing the first conductive layer 131, a second blocking insulating layer 121 extending on surfaces of the interlayer spaces S and on a surface of the slit SI may be further formed.

The first conductive layer 131 may be formed of various conductive materials having low resistance, for example, metal. The first conductive layer 131 may be formed of metal used as a seed layer of the second conductive layer to be formed in a sequential process. For example, the first conductive layer 131 may include tungsten.

The first conductive layer 131 may be deposited in enough thickness to completely fill the interlayer spaces S. The first conductive layer 131 may be formed on the side wall of the slit SI.

Figure 4D:
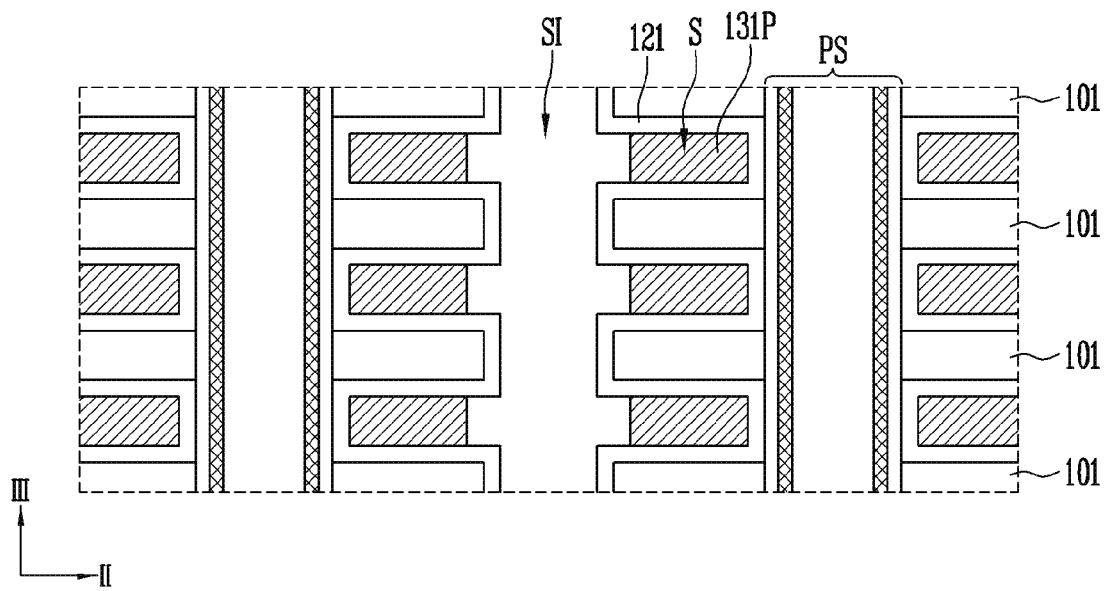

Referring to FIG. 4D, the first conductive layer 131 may be etched so that the first conductive layer 131 as described in FIG. 4C may be removed inside the slit SI, and the first conductive layer 131 may remain in a portion of each of the interlayer spaces S. First conductive patterns 131P may be patterned to fill portions of the interlayer spaces S adjacent to each of the pillar structures PS without deviating from the interlayer spaces S. The first conductive patterns 131P may be indented toward the pillar structures PS further than the interlayer insulating layers 101.

Figure 4E:
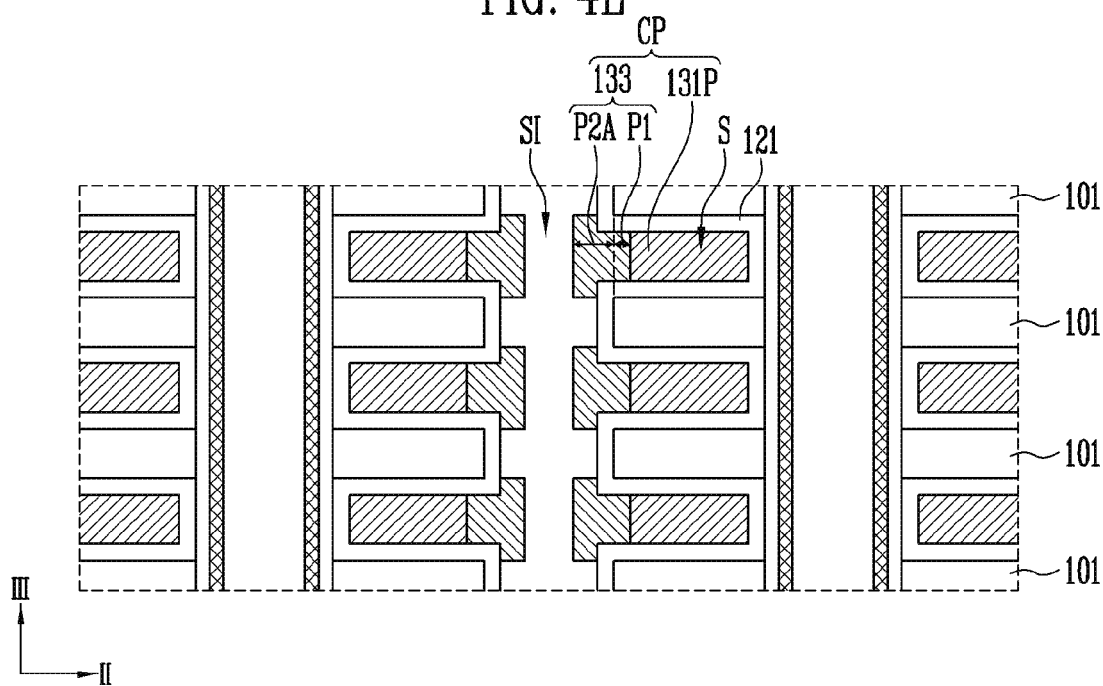

Referring to FIG. 4E, the second conductive patterns 133 may be formed on sidewalls of the first conductive patterns 131P through the slit SI to fill the remaining portions of the interlayer spaces S. The second conductive patterns 133 may be formed by using a selective growth method that uses the first conductive patterns 131P as a seed layer. In this case, the second conductive patterns 133 may grow from the first conductive patterns 131P. Each of the second conductive patterns 133 grown from the first conductive patterns 131P may include the first portion P1 arranged inside the single interlayer space S corresponding thereto and a second portion P2A extending outwardly from the first portion P1 toward the outside of the single interlayer space S corresponding thereto. When forming the second conductive patterns 133 by using a selective growth method, a bridge error where the second conductive patterns 133 corresponding to the interlayer spaces S arranged on the different layers are connected to one another may be easily controlled by controlling a growth thickness of the second portion P2A. As the growth thickness of the second portion P2A increases, resistance of each of the second conductive patterns 133 may be reduced by increasing a volume of the second conductive patterns 133.

The second conductive pattern 133 may grow from the first conductive patterns 131P and be formed of the same metal as the first conductive patterns 131P. For example, the second conductive patterns 133 may include tungsten. In an embodiment, the second conductive pattern 133 may have a greater resistivity than each of the first conductive patterns 131P.

Figure 4F:
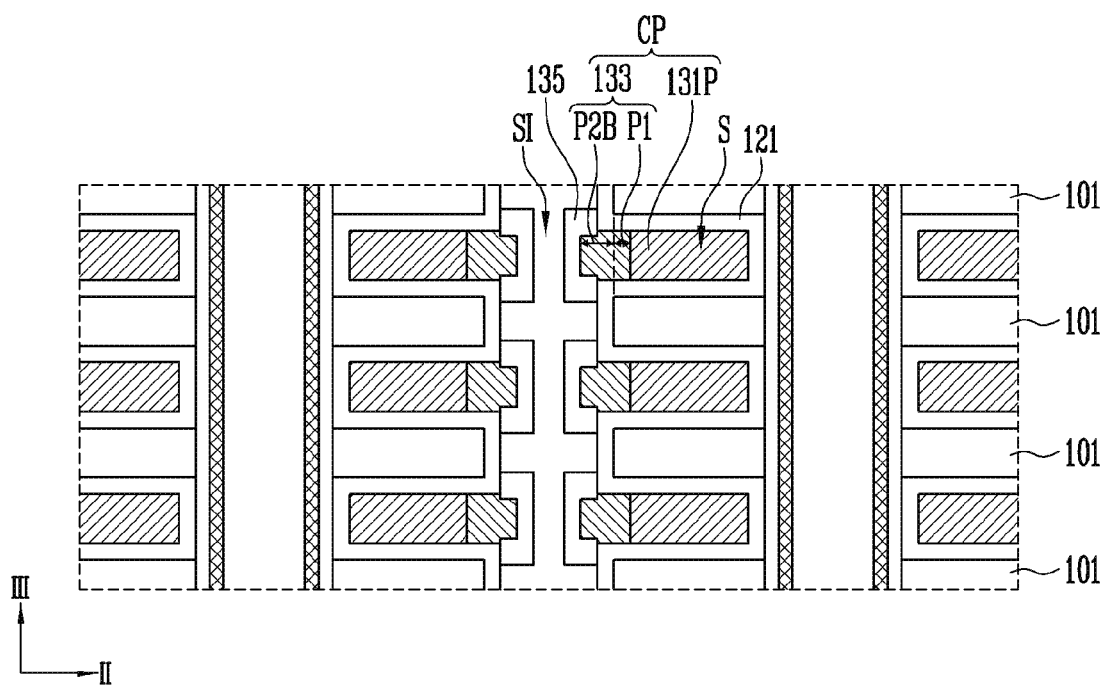

Referring to FIG. 4F, in the process of forming the second conductive patterns 133 as described in 4E, when each of the second conductive patterns 133 is excessively grown to reduce resistance of the second conductive patterns, the second conductive patterns 133 on the different layers may not be insulated from one another. To prevent the above, a portion of the second portion P2A of each of the second conductive patterns 133 as described in FIG. 4E may be oxidized to a predetermined thickness by performing an oxidizing process. As a result, an isolation layer 135 may be formed on a surface of a non-oxidized second portion P2B. The non-oxidized second portion P2B may be used as a portion of each of the conductive patterns CP. The oxidizing process may include a thermal oxidation or a radical oxidation. The oxidizing process may be performed at 600° C. to 1000° C. For example, the oxidizing process may be performed at 730° C. to 780° C.

Each of the conductive patterns CP may include the first conductive pattern 131P arranged inside the single interlayer space S corresponding thereto and a second conductive pattern 133 sealed between the first conductive pattern 131P and the isolation layer 135. The second conductive pattern 133 may include the first portion P1 arranged inside the single interlayer space S corresponding thereto, and the non-oxidized second portion P2B that protrudes from the first portion P1 to the outside of the single interlayer space S corresponding thereto. Therefore, a volume of the second conductive patterns 133 may be increased though the non-oxidized second portion P2B.

The isolation layer 135 may be formed by oxidizing a surface of the second portion P2A as described in FIG. 4E, thereby minimizing reduction of the volume of the conductive pattern CP. The oxidizing process for forming the isolation layer 135 may be controlled so that the remaining non-oxidized second portion P2B may remain to protrude toward the slit SI rather than edges of the interlayer insulating layers 101 adjacent to the slit SI. When the second blocking insulating layer 121 is formed, the isolation layer 135 may contact the second blocking insulating layer 121. Although not illustrated in FIG. 4E, when the second blocking insulating layer 121 is not formed, the isolation layer 135 may contact the interlayer insulating layer 101. To contact the isolation layer 135 to the second blocking insulating layer 121 or the interlayer insulating layer 101, an oxidizing thickness of the second portion P2A illustrated in 4E may be controlled in the oxidizing process.

The isolation layer 135 may be an oxide of the second conductive pattern 133. For example, when the second conductive pattern 133 includes tungsten, the isolation layer 135 may include a tungsten oxide.

Figure 4G:
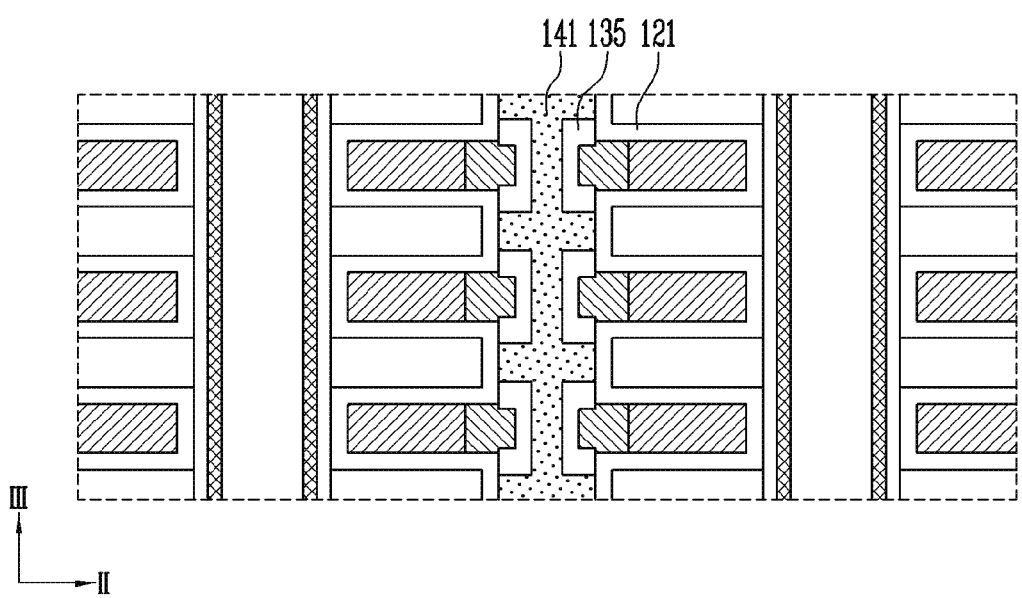

Referring to FIG. 4G, a slit insulating layer 141 filling the inside of the slit SI may be formed. The slit insulating layer 141 may contact the isolation layer 135.

Figure 5A:
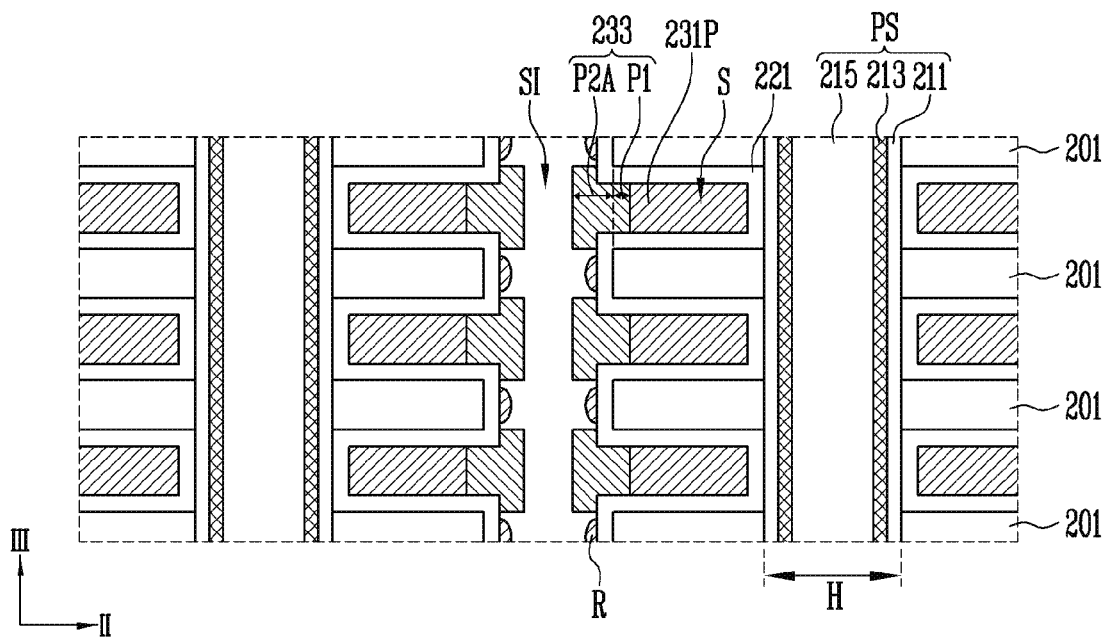
FIGS. 5A and 5B are cross-sectional diagrams illustrating a representation of an example of a manufacturing method of a semiconductor device according to an embodiment of the present disclosure.
Figure 5B:
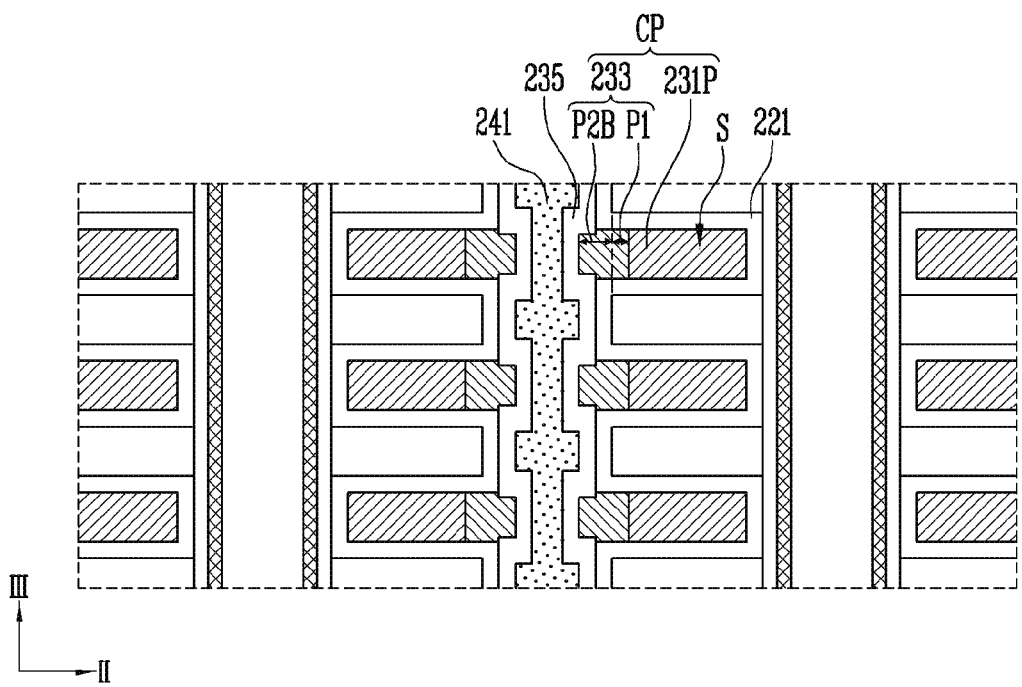

FIGS. 5A and 5B are cross-sectional diagrams illustrating a representation of an example of a manufacturing method of a semiconductor device according to an embodiment of the present disclosure. A manufacturing method of the semiconductor device illustrated in FIGS. 5A and 5B may be used for forming the semiconductor device illustrated in FIG. 1B. FIGS. 5A and 5B are cross-sectional diagrams of the semiconductor device cut along the second direction II of the extension direction of the bit lint BL illustrated in FIGS. 3A to 3C.

Referring to 5A, by performing the same process as described in FIGS. 4A to 4E, the pillar structures PS arranged inside the holes H penetrating interlayer insulating layers 201, the slit SI penetrating the interlayer insulating layers 201, first conductive patterns 231P filling the interlayer spaces S arranged between the interlayer insulating layers 201, and second conductive patterns 233 contacting the first conductive patterns 231P and protruding toward the slit SI from the inside of the interlayer spaces S may be formed.

Each of the pillar structures PS may include a multilayer 211, a channel layer 213 and a core insulating layer 215.

A second blocking insulating layer 221 may be further formed prior to forming the first conductive patterns 231P as described in FIG. 4C.

Each of the first conductive patterns 231P may fill a portion of the single interlayer space S corresponding thereto, and the first portion P1 of each of the second conductive patterns 233 may fill the remaining portion of the single interlayer space S corresponding thereto. The second portion P2A of each of the second conductive patterns 233 may extend toward the slit SI from the first portion P1.

During the process of forming the first conductive patterns 231P and the second conductive patterns 233 as described above, a remaining conductive material R may remain on edges of the interlayer insulating layers 201 defined along the slit SI.

Referring to FIG. 5B, a portion of the second portion P2A of each of the second conductive patterns 233 illustrated in FIG. 5A may be oxidized in a predetermined thickness from the surface thereof. The remaining conductive material R illustrated in FIG. 5A and the second portion P2A of each of the second conductive patterns 233 may be concurrently oxidized. Due to an oxidized area of the remaining conductive material R, the oxidized areas of the second conductive patterns 233 may be connected to one another. As a result, an isolation layer 235 may extend on the edges of the interlayer insulating layers 201 and on the surface of the non-oxidized second portion P2B.

A slit insulating layer 241 filling the inside of the slit SI may be formed. The slit insulating layer 241 may contact the isolation layer 235.

In an embodiment, the resistance of the conductive pattern may be reduced by extending the conductive pattern between the interlayer insulating layers to deviate from the interlayer space between the interlayer insulating layers.

In an embodiment, by forming the isolation layer by oxidizing a portion of the conductive pattern deviating from the interlayer space, a bridge phenomenon where the conductive pattern and the lower conductive pattern or the conductive pattern and the upper conductive pattern are electrically connected may be prevented through the isolation layer. An insulating distance between the conductive pattern and the lower conductive pattern and an insulating distance between the conductive pattern and the upper conductive pattern may be achieved by the isolation layer.

Figure 6:
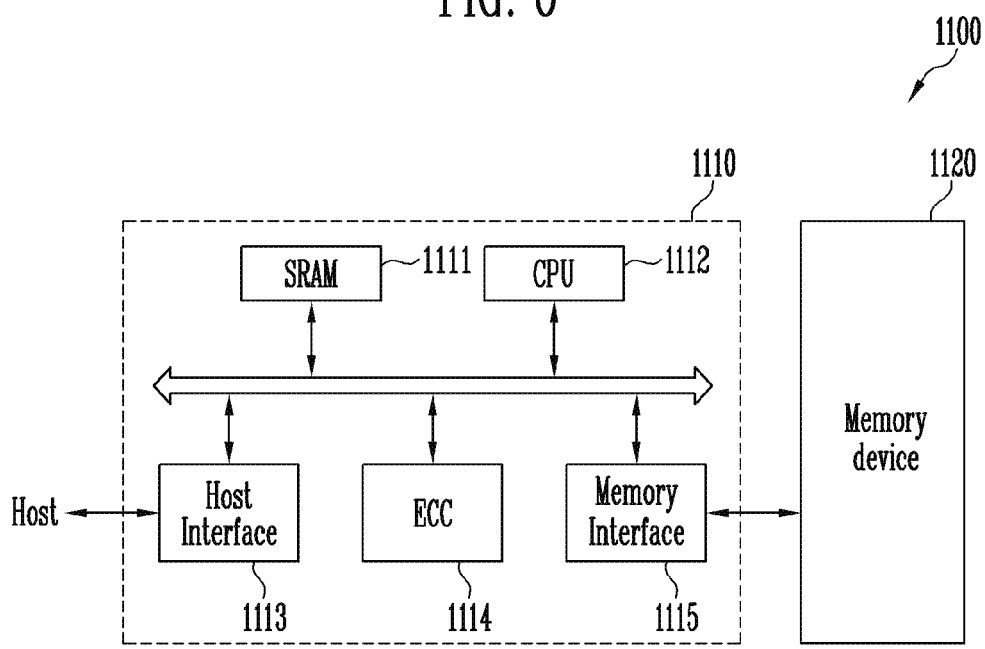
FIG. 6 is a block diagram illustrating a representation of an example of a memory system according to an embodiment of the present disclosure.

FIG. 6 is a block diagram illustrating a representation of an example of a memory system according to an embodiment of the present disclosure.

Referring to FIG. 6, a memory system 1100 according to an embodiment may include a memory device 1120 and a memory controller 1110.

The memory device 1120 may include at least one of the structures as described in FIGS. 1A and 1B. The memory device 1120 may include at least one of the memory strings as described in FIGS. 3A to 3C, and the memory strings may include at least one of the structures as described in FIGS. 1A and 1B. The memory strings may be formed by using the processes as described in FIGS. 4A to 4G, or the processes as described in FIGS. 5A and 5B.

The memory device 1120 may be a multi-chip package consisting of a plurality of flash memory chips. According to an embodiment, resistance of the conductive patterns constituting the chip may be reduced without the increase of the chip size, and the bridge error between the different conductive patterns may be improved.

The memory controller 1110 may be configured to control the memory device 1120, and include a static random access memory (SRAM, 1111), a CPU 1112, host interface 1113, an error correction code (ECC, 1114), and memory interface 1115. The SRAM 1111 may be used as an operation memory of the CPU 1112, the CPU 1112 may perform a general control operation for data exchanged of the memory controller 1110, and the host interface 1113 may include a data exchange protocol contacting the memory system 1100. In addition, the ECC 1114 may detect and correct the error included in the data read from the memory device 1120, and the memory interface 1115 may perform interfacing with the memory device 1120. Further, the memory controller 1110 may further include a read only memory (ROM) that stores code data for interfacing with the host and the like.

The memory system 1100 as described above may be a memory card in which the memory device 1120 is combined with the controller 1110 or a solid state disk (SSD). For example, when the memory system 1100 is the SSD, the memory controller 1110 may communicated with an external source (for example, a host) through one of the various interface protocols such as universal serial bus (USB), multimedia card (MMC), peripheral component interconnection-express (PCI-E), serial advanced technology attachment (SATA), parallel advanced technology attachment (PATA), small computer small interface (SCSI), enhanced small disk interface (ESDI), and integrated drive electronics (IDE).

Figure 7:
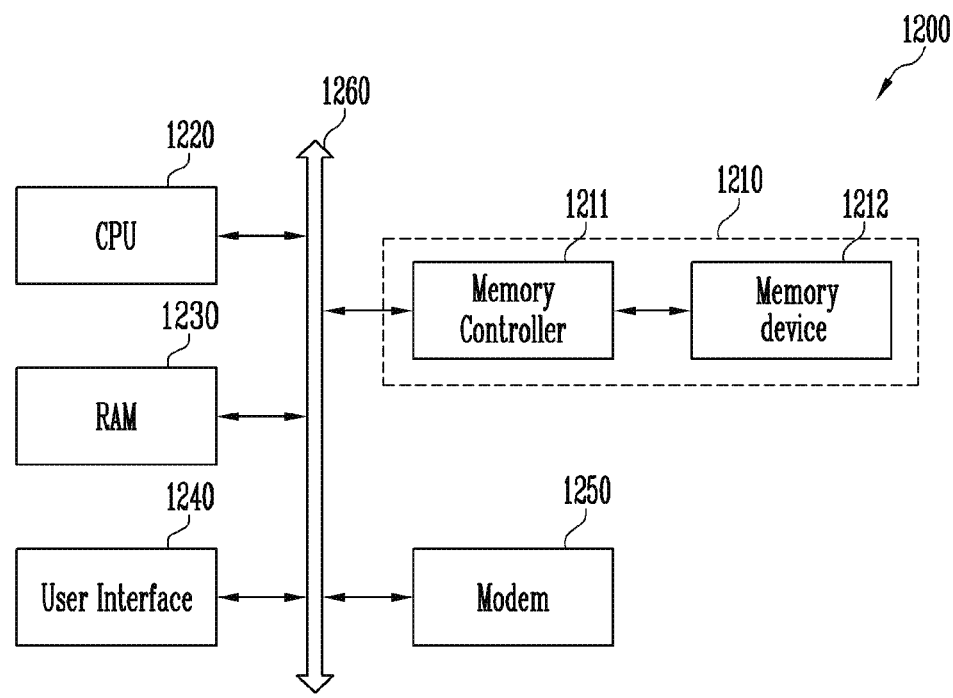
FIG. 7 is a block diagram illustrating a representation of an example of a computing system according to an embodiment of the present disclosure.

FIG. 7 is a block diagram illustrating a representation of an example of a computing system according to an embodiment of the present disclosure.

Referring to FIG. 7, the computing system 1200 according to an embodiment may include the CPU 1220 electrically connected to system bus 1260, a random access memory (RAM, 1230), user interface 1240, modem 1250, a memory system 1210. In addition, when the computing system 1120 is a mobile device, a battery for supplying an operation voltage to the computing system 1200 may be further included, and an application chipset, a camera image processor (CIS), and a mobile dynamic random access memory (DRAM) and the like may be further included.

The memory system 1210 may consist of the memory device 1212 and the memory controller 1211 as described in reference to FIG. 6.

Examples of embodiments have been disclosed herein, and although specific terms are employed, they are used and are to be interpreted in a generic and descriptive sense only and not for purpose of limitation. Accordingly, it will be understood by those of skill in the art that various changes may be made without departing from the spirit and scope of the disclosure as set forth in the following claims.

What is claimed is:

1. A semiconductor device, comprising:
a channel layer;
interlayer insulating layers surrounding the channel layer and stacked to be spaced apart from one another along an extension direction of the channel layer, wherein each of the interlayer insulating layers has a first sidewall facing the channel layer and a second sidewall opposite to the first sidewall;
conductive patterns including main portions and protruding portions extending from the main portions, respectively, the main portions filling interlayer spaces between the insulating layers adjacent to one another, the protruding portions deviating from the interlayer spaces; and
first isolation layers covering the conductive patterns, wherein the conductive patterns are disposed between the first isolation layers and the channel layer,
wherein a distance between the channel layer and each of boundaries, which are defined between the conductive patterns and the first isolation layers at levels of the interlayer spaces, is longer than a distance between the channel layer and the second sidewall of each of the interlayer insulating layers, and
wherein a distance between the protruding portions of the conductive patterns in the extension direction of the channel layer is longer than a distance between the main portions of the conductive patterns in the extension direction of the channel layer,
wherein each of the conductive patterns comprises:
a first conductive pattern filling a portion of each of the interlayer spaces and surrounding the channel layer; and
a second conductive pattern including a first portion contacting the first conductive pattern and filling a remaining portion of each of the interlayer spaces and a second portion extending outwardly to an outside of each of the interlayer spaces from the first portion, and
wherein the second sidewall of each of the interlayer insulating layers further protrudes than a sidewall of the first conductive pattern.

2. The semiconductor device of claim 1, wherein the conductive patterns have a greater volume than the interlayer spaces.

3. The semiconductor device of claim 1, wherein the first conductive pattern and the second conductive pattern are formed of substantially the same metal.

4. The semiconductor device of claim 1, wherein each of the first isolation layers includes a tungsten oxide.

5. The semiconductor device of claim 1, further comprising a slit defining the second sidewall of each of the interlayer insulating layers.

6. The semiconductor device of claim 5, wherein the first isolation layers are connected by a second isolation layer formed on the second sidewall of each of the interlayer insulating layers.

7. The semiconductor device of claim 5, wherein the conductive patterns protrude further toward the slit than the second sidewall of each of the interlayer insulating layers.

8. The semiconductor device of claim 1, wherein the interlayer spaces filled with the conductive patterns are sealed by the first isolation layers.

9. The semiconductor device of claim 1, wherein the conductive patterns are electrically separated by the first isolation layers.

10. The semiconductor device of claim 1, wherein the first isolation layers are arranged to be spaced apart from one another.

* * * * *